(12) United States Patent
Song et al.

(10) Patent No.: US 12,162,059 B1
(45) Date of Patent: Dec. 10, 2024

(54) PRECISION ROLL BENDING METHOD, SYSTEM, AND ELECTRONIC EQUIPMENT FOR CYLINDER WITH VARIABLE CURVATURE SECTION

(71) Applicant: WUHAN UNIVERSITY OF TECHNOLOGY, Wuhan (CN)

(72) Inventors: Yanli Song, Wuhan (CN); Xuchu Wang, Wuhan (CN); Lin Hua, Wuhan (CN); Jue Lu, Wuhan (CN); Weihao Li, Wuhan (CN)

(73) Assignee: WUHAN UNIVERSITY OF TECHNOLOGY, Wuhan (CN)

( * ) Notice: Subject to any disclaimer, the term of this patent is extended or adjusted under 35 U.S.C. 154(b) by 0 days.

(21) Appl. No.: 18/648,409

(22) Filed: Apr. 28, 2024

(30) Foreign Application Priority Data

Oct. 23, 2023 (CN) .......................... 202311368795.7

(51) Int. Cl.
  *B21D 5/00* (2006.01)
  *B21D 5/14* (2006.01)
(52) U.S. Cl.
  CPC .............. *B21D 5/004* (2013.01); *B21D 5/14* (2013.01)
(58) Field of Classification Search
  CPC ...... G06F 30/23; G06F 30/20; G06F 2111/10; G06F 2113/24; G06F 2119/14; G06F 2113/14; B21D 5/00; B21D 5/004; B21D 31/005
See application file for complete search history.

(56) References Cited

FOREIGN PATENT DOCUMENTS

| CN | 104281725 A | 1/2015 |
| CN | 105414351 A | 3/2016 |
| CN | 109684753 A | 4/2019 |

(Continued)

OTHER PUBLICATIONS

H. Kan and Z. Hailing, "A springback reduction method for sheet metal bending," 2011 International Conference on Mechatronic Science, Electric Engineering and Computer (MEC), Jilin, China, 2011, pp. 617-620, 2011 (Year: 2011).*

(Continued)

*Primary Examiner* — Darrin D Dunn
(74) *Attorney, Agent, or Firm* — Daniel M. Cohn; Howard M. Cohn

(57) ABSTRACT

Disclosed is a method, system, and electronic device for precision roll bending of cylinder with variable curvature section. The method first obtains process parameters of roll bending of a target cylinder, and then conducts roll bending rebound simulation of the cylinder based on the process parameters to determine influence factors of rebound compensation error. Then, multiple sets of different preset influence factor values are set to perform roll bending rebound simulation of different arc segments. This disclosure uses multiple simulations of the rebound caused by cylinder roll bending to determine the factors that affect the rebound compensation error and the magnitude of the rebound compensation error that may be caused by these factors. Finally, an expression for the rebound compensation error is obtained to correct the rebound compensation equation, eliminating the error caused by rebound compensation, and ensuring that the cylinder forming meets the expected accuracy requirements.

7 Claims, 3 Drawing Sheets

(56) References Cited

FOREIGN PATENT DOCUMENTS

| CN | 111229879 A | * | 6/2020 | ............... B21D 5/02 |
|---|---|---|---|---|
| CN | 114357804 A | | 4/2022 | |
| CN | 115238495 A | | 10/2022 | |
| CN | 115283500 A | | 11/2022 | |
| CN | 115935734 A | | 4/2023 | |
| EP | 3866043 A1 | | 8/2021 | |

OTHER PUBLICATIONS

Research on a Control Strategy of the Symmetrical Four-Roller Bending Process Based on Experiment and Numerical Simulation Hongqiang Cao 1,2, Gaochao Yu 1,2,*, Chunfang Yang 1,2 and Jun Zhao 1, 2021 (Year: 2021).*

Study on multiple-step incremental air-bending forming of sheet metal with springback model and FEM simulation Zemin Fu & Jianhua Mo & Wenxian Zhang, 2009 (Year: 2009).*

Springback prediction model and its compensation method for the variable curvature metal tube bending forming Shuyou Zhang1 & Mengyu Fu1 & Zili Wang1 & Dingyu Fang1 & Weiming Lin2 & Huifang Zhou, 2021 (Year: 2021).*

Experimental and numerical prediction and comprehensive compensation of springback in cold roll forming of UHSS (Year: 2020).*

Notification to Grant Patent Right for Invention, Chinese Application No. 202311368795.7, mailed Oct. 23, 2023 (3 pages).

CNIPA, Office Action issued for Chinese Application No. 202311368795.7, mailed Dec. 1, 2023 (17 pages).

Dong, Haoxiang et al. Prediction and control on stamping multi-process precision transfer for exhaust tail pipe based on GRA-RSM, "Forging & Stamping Technology", vol. 47, Issue 11, No. 101-108 Page, Issue date Nov. 30, 2022 (8 pages).

Guo, Haoyu et al. Research on Numerical Simulation of Aluminum Profile Stretch Bending and Compensation Method for Springback, No. B022-378 Page, Issue date Feb. 28, 2022 (78 pages).

Lingbeek, R.et al. Springback Compensation: Fundamental Topics and Practical Application, "Proceedings of ESAFORM", full text, Issue date Dec. 31, 2006 (4 pages).

Lu, Jue, et al. Effect of temperature on friction and galling behavior of 7075 aluminum alloy sheet based on ball-on-plate sliding test, "Tribplpgy International", vol. 40, No. 105872 Page, Issue date Dec. 31, 2019 (12 pages).

Xu, Zhenhua et al. Springback prediction of the tube bending based on free bending technology, "Computer Integrated Manufacturing Systems", vol. 29, Issue 8, full text, Issue date Aug. 31, 2023 (11 pages).

* cited by examiner

PRECISION ROLL BENDING METHOD, SYSTEM, AND ELECTRONIC EQUIPMENT FOR CYLINDER WITH VARIABLE CURVATURE SECTION

FIELD OF THE DISCLOSURE

The disclosure relates to the technical field of variable curvature section cylinder processing, in particular to a precision roll bending method, system, and electronic equipment for cylinder with variable curvature section.

BACKGROUND

Aluminum alloy tank is an important component of special transportation vehicles, playing a role in storing and transporting energy items such as gasoline, diesel, kerosene, natural gas, as well as chemical items such as acids, alkalis, salts, alcohols, and esters. It is usually used in harsh working conditions such as vibration impact, fatigue, and corrosion. Therefore, the quality of its forming and manufacturing is crucial for the safety of storage and transportation.

Tank body is usually designed as a variable curvature section to reduce the center of mass, improve stability, and disperse the pressure of the medium on the tank wall during transportation. However, it also makes it difficult to manufacture the tank body accurately through traditional processes. At present, three-roll plate rolling machine is limited by its structure and number of rolls, and is generally used for forming parts with regular cross-sectional shapes, and the forming accuracy is not high. Four-roll plate rolling machine is an improvement on the three-roll plate rolling machine, with more complete functions and advantages such as high efficiency and small remaining straight edges. Therefore, application scenarios and fields of the four-roll plate rolling machine has surpassed those of three-roll plate rolling machine, and is favored by various industries. For complex cylinder bodies with variable curvature sections, repeated manual trial and error, measurement, and shaping are required during the roll bending process. However, due to the continuous local loading characteristics of roll bending, the rebound of the sheet metal accumulates along the variable curvature section, resulting in ±10 mm butt gaps or stacking after the cylinder body is formed. Subsequent welding and assembly increase excessive constraint stress, greatly increasing the risk of stress fatigue corrosion.

At present, a Chinese patent titled "A Roll Bending Method for Shell Sheet Metal" with a public number of CN112588895B proposes a method of using a four-roll plate rolling machine to produce a variable curvature section cylinder. This method utilizes real-time monitoring of the straightness error of the shell sheet metal busbar to compensate for and control the cross-sectional curvature of the cylinder, in order to reduce the impact of rebound problems. However, in the actual processing of the cylinder, due to the influence of the specific environment, there may still be errors in rebound compensation control during the processing, which leads to the inability of final finished cylinder to achieve satisfactory accuracy despite the rebound compensation. Therefore, there is a need for a precise forming method for variable curvature section cylinders that can reduce rebound compensation errors.

SUMMARY

The purpose of this disclosure is to provide a precision roll bending method, system, and electronic equipment for cylinder with variable curvature section to solve the problem of inaccurate forming of variable curvature cross-section cylinders due to errors in rebound compensation control in existing technologies.

This disclosure provides A precision roll bending method for cylinder with variable curvature section, comprising:
 obtaining process parameters of roll bending of a target cylinder, and establishing a rebound compensation equation based on force analysis of the roll bending; the target cylinder comprises multiple arc segments;
 carrying out rebound simulation of cylinder roll bending based on the process parameters to obtain a first simulation result, and determining influence factors of rebound compensation error based on distribution of rebound amount in the first simulation result;
 setting multiple sets of different preset influence factor values of the influence factors of rebound compensation error; based on the multiple sets of preset influence factor values, combined with the process parameters, carrying out the rebound simulation of roll bending of different arc segments to obtain a second simulation result;
 fitting multiple sets of preset influence factor values and corresponding rebound compensation errors in the second simulation result, and obtaining expression of rebound compensation error;
 modifying the rebound compensation equation according to the expression of rebound compensation error, and carrying out precise control of roll bending of the target cylinder according to the modified rebound compensation equation and the process parameters.

Compared with the prior art, the beneficial effects of this disclosure are: this disclosure provides a precision roll bending method, system, and electronic device for cylinder with variable curvature section. The method first obtains process parameters of the roll bending of a target cylinder, and establishes a rebound compensation equation based on force analysis of the roll bending. The target cylinder comprises multiple arc segments. Then, based on the process parameters, the cylinder roll bending rebound simulation is carried out to obtain the first simulation result. Based on the distribution of rebound amount in the first simulation result, the influence factors of rebound compensation error are determined. Then, multiple sets of different preset influence factor values of rebound compensation error are set. Based on multiple preset influencing factor values and combined with the process parameters, roll bending rebound simulation of different arc segments is carried out to obtain the second simulation result. Then, the multiple preset influencing factor values and corresponding rebound compensation error values in the second simulation result are fitted to obtain the expression of rebound compensation error. Finally, the rebound compensation equation is corrected according to the expression of rebound compensation error, and the precision roll bending of the target cylinder is controlled based on the corrected rebound compensation equation and the process parameters. Compared to existing technologies, this disclosure uses multiple simulations of the rebound caused by cylinder roll bending to determine the factors that affect the rebound compensation error and the magnitude of the rebound compensation error that may be caused by these factors. Finally, an expression for the rebound compensation error is obtained to correct the rebound compensation equation, eliminate the error caused by rebound compensation, and ensure that the cylinder forming meets the expected accuracy requirements.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The technical solutions in the embodiments of the application will be described clearly and completely in combination with the drawings in the embodiments of the application.

This disclosure provides a precision roll bending method, system, and electronic equipment for cylinder with variable curvature section, as explained below.

Figure 1:
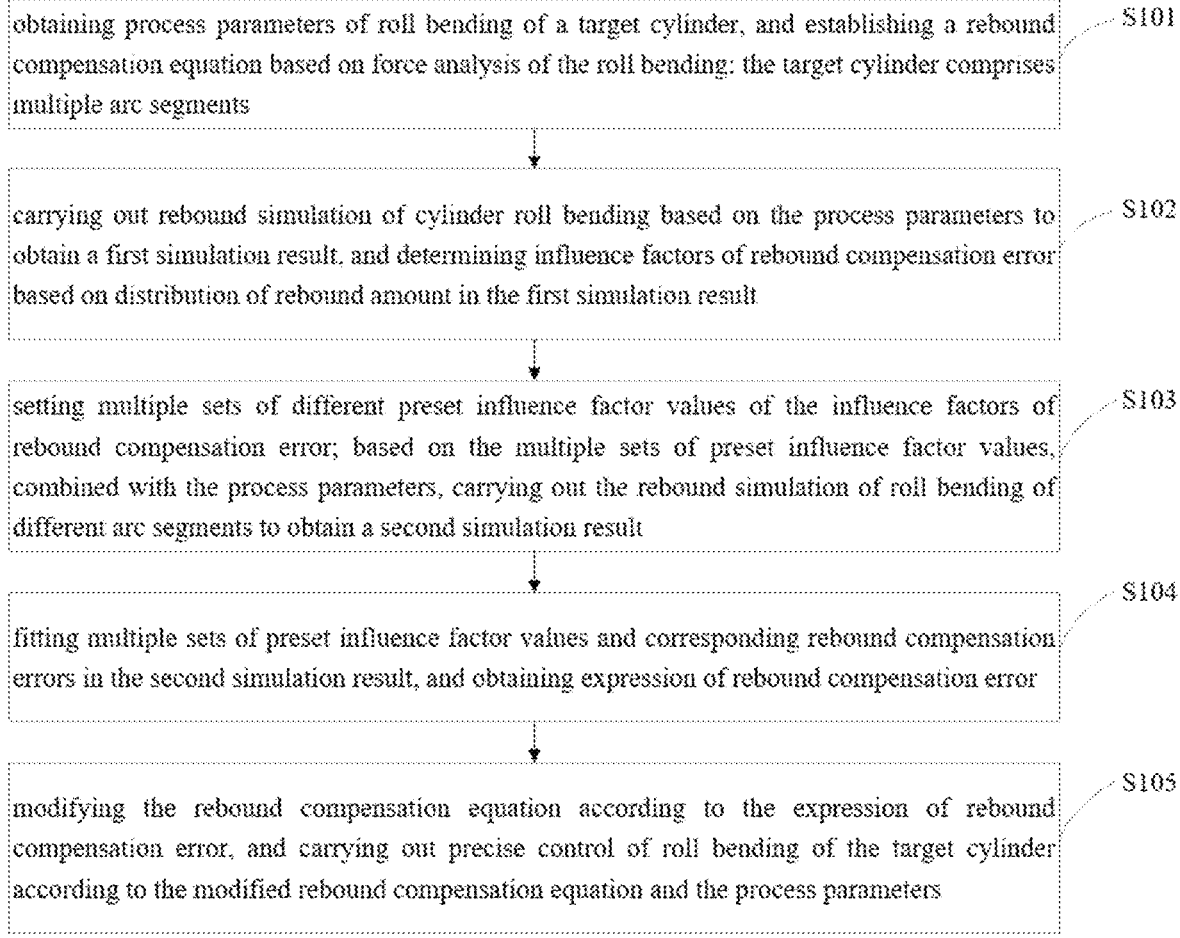
FIG. 1 is a method flowchart of an embodiment of the precision roll bending method for cylinder with variable curvature section provided by this disclosure.

As shown in FIG. 1, an embodiment of this disclosure provides a precision roll bending method for cylinder with variable curvature section, comprising:

S101, obtaining process parameters of roll bending of a target cylinder, and establishing a rebound compensation equation based on force analysis of the roll bending; the target cylinder comprises multiple arc segments;

S102, carrying out rebound simulation of cylinder roll bending based on the process parameters to obtain a first simulation result, and determining influence factors of rebound compensation error based on distribution of rebound amount in the first simulation result;

S103, setting multiple sets of different preset influence factor values of the influence factors of rebound compensation error; based on the multiple sets of preset influence factor values, combined with the process parameters, carrying out the rebound simulation of roll bending of different arc segments to obtain a second simulation result;

S104, fitting multiple sets of preset influence factor values and corresponding rebound compensation errors in the second simulation result, and obtaining expression of rebound compensation error;

S105, modifying the rebound compensation equation according to the expression of rebound compensation error, and carrying out precise control of roll bending of the target cylinder according to the modified rebound compensation equation and the process parameters.

Compared to existing technologies, this disclosure uses two rounds of cylinder roll bending rebound simulation to determine the influence factors of rebound compensation error and the amount of rebound compensation error that may be caused by these factors. Finally, an expression for rebound compensation error is obtained to correct the rebound compensation equation, which eliminates the error caused by rebound compensation, and ensures that the cylinder forming meets the expected accuracy requirements.

In a preferred embodiment, in step S101 above, the process parameters comprise equipment parameters for processing the cylinder, plate parameters for producing the cylinder, processing method, and relevant equations used, among which equipment parameters such as rolling machine parameters: upper roll radius, side roll inclination angle, etc.; plate parameters such as elastic modulus and thickness of the plate; processing method and related equations used comprise the curvature division method of the cylinder, processing sequence, and the expression of the radius relationship before and after the rebound of the sheet metal (rebound compensation equation).

In a preferred embodiment, as described in step S102 above, based on the distribution of rebound amount in the first simulation result, the influence factors of rebound compensation error are determined, comprising:

based on the distribution of rebound amount in the first simulation result, obtaining a rebound variation curve;

determining the factors affecting the rebound compensation error based on the variation law of the rebound amount of each arc segment in the rebound variation curve.

The above process analyzes the influence factors of rebound compensation error through the rebound variation curve, which is more intuitive and interpretable. In practice, factors affecting rebound compensation errors can also be analyzed through other methods, such as clustering variables that have a significant impact on rebound compensation errors.

Figure 2:
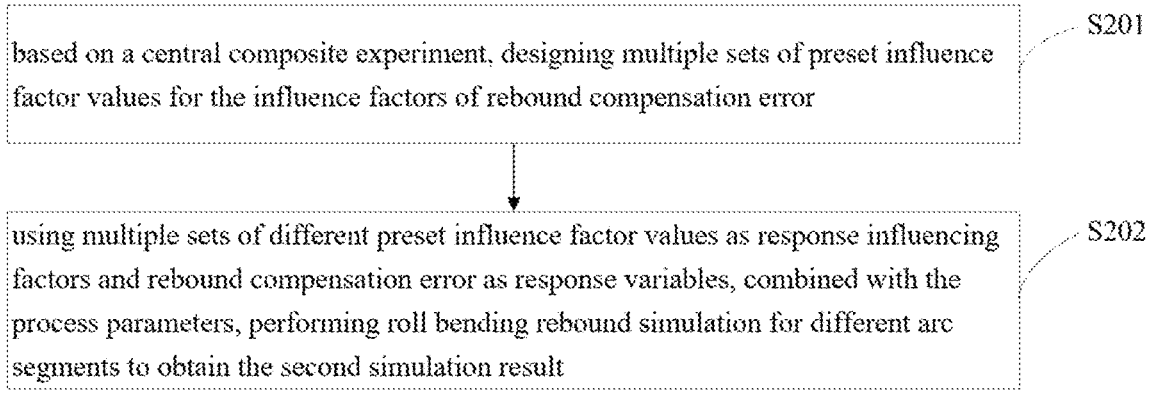
FIG. 2 is a method flowchart of an embodiment of step S103 in FIG. 1.

Furthermore, as shown in FIG. 2, in a preferred embodiment, the above step S103 that setting multiple sets of different preset influence factor values of the influence factors of rebound compensation error; based on the multiple sets of preset influence factor values, combined with the process parameters, carrying out the rebound simulation of roll bending of different arc segments to obtain a second simulation result, which specifically comprises:

S201, based on a central composite experiment, designing multiple sets of preset influence factor values for the influence factors of rebound compensation error;

S202, using multiple sets of different preset influence factor values as response influencing factors and rebound compensation error as response variables, combined with the process parameters, performing roll bending rebound simulation for different arc segments to obtain the second simulation result.

In the above process, the central composite experiment is a research method commonly used to evaluate the impact of different treatments or interventions on specific outcome variables. It is conducted under experimental conditions, where the study subjects are randomly assigned to different treatment groups to compare the impact of different treatments on the results.

The central composite experiment can maximize the control of other variables that may affect the results by randomly assigning and controlling treatment groups. This can more clearly determine the actual impact of individual treatments on the results. And due to the experimental design of the central composite experiment, strong causal evidence can be obtained. By randomly assigning treatment and control groups, interference from other factors can be excluded, and the reasons for the changes in results caused by the treatment can be more determined. In addition, the central composite test also has advantages such as repeatability and good generalization ability. The preset influence factor values based on central composite experimental design have good rationality and scientificity, making the analysis results more accurate.

Specifically, in a preferred embodiment, the above step S201, based on a central composite experiment, designing multiple sets of preset influence factor values for the influence factors of rebound compensation error, comprising:

based on the central composite experience, using multiple rebound compensation error influencing factors as independent variables; based on multiple horizontal values, designing multiple sets of preset influencing factor values based on multiple factors and levels.

Multi-factor and multi-level experiment is an experiment that designs and executes multiple factors, each with multiple levels. In this experimental design, researchers simultaneously consider the influence of multiple factors (i.e., independent variables) on the outcome variable to determine the independent and interactive effects of different factors and their levels on the results.

Multi-factor and multi-level experiments can provide more comprehensive and accurate data by considering the interaction between multiple factors and different levels, in order to evaluate the impact of different combinations of factors on the results. This helps to have a more accurate understanding of the relative importance of factors and their interactions. In addition, multi-factor and multi-level experiments allow researchers to simulate complex real-world environments and consider the interactions between different factors. This helps to better understand and predict the impact of various factors on the results in actual situations. Through multi factor and multi-level experiments, researchers can discover the impact of some unexplored and hidden factors on the results. By evaluating multiple factors, it is possible to identify unexpected associations or causal relationships. In addition, multi factor and multi-level experiments can also save resources.

In practice, based on the number of factors affecting rebound compensation error and the number of preset level values, multiple sets of preset influencing factor values for rebound compensation error can be designed based on methods such as three factors and two levels, and six factors and five levels.

Furthermore, in a preferred embodiment, step S104 that fitting multiple sets of preset influence factor values and corresponding rebound compensation errors in the second simulation result, and obtaining expression of rebound compensation error, specifically comprises:

Based on Response Surface Methodology, multiple sets of preset influence factor values and corresponding rebound compensation error amounts in the second simulation result are fitted to obtain an expression for the rebound compensation error amount. Expression for the rebound compensation error amount is a polynomial with the rebound compensation error influence factor as independent variable and rebound compensation error amount as dependent variable.

In the above process, Response Surface Methodology is a statistical modeling and experimental design method used to study the impact of multiple factors on outcome variables and determine the optimal combination of factor levels. In response surface methodology, a series of experiments are designed to explore the impact of various factors on results at different levels of combination, and a mathematical model is established to describe the relationship between factors and results. Then, using this model for optimization to find the optimal combination of factor levels with the best results.

Response Surface Methodology can not only determine the impact of individual factors on results, but also study the interaction between factors. By establishing a mathematical model, the comprehensive impact of multiple factors on the results can be comprehensively considered, and the optimal combination of factor levels can be found. In addition, response surface methodology can visually present the changes in results under different combinations of factor levels by drawing response surface graphs. This allows researchers to have a more intuitive understanding of the relationships between factors and to find the optimal operating conditions. It describes the relationship between factors and outcomes by establishing mathematical models. This model can be used to predict results under unknown conditions and perform sensitivity analysis to evaluate the importance of different factors on the results. The response surface methodology also has the advantage of high efficiency.

The fitting results obtained based on the Response Surface Methodology make the compensation of rebound compensation error more accurate. At the same time, the expression of rebound compensation error in this embodiment is convenient for computer calculation and analysis, improving producing efficiency of the cylinder.

Furthermore, in a preferred embodiment, in step S105 above, the modified rebound compensation equation is:

$$r'=f(r+\mu)$$

where, r' represents the curvature radius of inner surface of the target cylinder before rebounding, r represents the curvature radius of the inner surface of the target cylinder after rebounding, and r=f(r) represents the rebound compensation equation before correction, u represents the expression of the rebound compensation error amount.

Furthermore, in a preferred embodiment, the modified rebound compensation equation is:

$$r' = \frac{1 - \frac{K_0 \sigma_\square}{E}}{\left(1 + \frac{(r+\mu)K_1\sigma_\square}{Et}\right)}(r+\mu)$$

where, $K_0$ represents the relative strengthening coefficient of the target cylinder's plate, $\sigma_\square$ represents the yield stress of the target cylinder's plate, E represents the elastic modulus of the target cylinder's plate, $K_1$ represents sectional shape coefficient of the target cylinder's plate, and t represents the thickness of the target cylinder's plate.

This disclosure also provides a more detailed embodiment to clearly illustrate the above processes S101 to S105:

The specific process in this embodiment is as follows:

The method proposed by this disclosure for roll bending of cylinder with variable curvature is applicable to cylinder of any cross-sectional shape. For the convenience of understanding, a four-segment circular arc near elliptical cross-section cylindrical body is used as an example for explanation. The specific steps are as follows:

1. Obtaining Process Parameters:
   1) Four-roll plate rolling machine parameters: upper roll radius 190 mm, lower roll radius 170 mm, side roll radius 140 mm, side roll inclination angle 20°, center distance between lower roll and side roll 360 mm. The intersection point of the extension line connecting the direction of movement of the side roller and the center of the upper and lower rollers is 623.1 mm away from the center of the upper and lower rollers; The distance between the intersection point of the extension line of the center of the side roller and the extension line of the upper and lower roller circles in the same direction of movement under the initial state is 1052.6 mm.
   2) plate material parameters of 5083-O aluminum alloy plate: elastic modulus E=70300 Mpa, yield stress $\sigma_\square$=145 MPa, plate thickness t=6 mm, relative strengthening coefficient $K_0$=3.3, and sectional shape coefficient $K_1$=1.5.
   3) based on sectional shape characteristics of the target cylinder and known plate thickness and material performance parameters, obtaining an analytical expression for the relationship between the radius of the sheet before and after rebound. The detailed steps are as follows:

outer layer length of the plate before rebound is $L_a$, inner layer length of the plate before rebound is $L_b$, and outer layer length of the plate after rebound is $L'_a$, and inner layer length of the plate after rebound is $L'_b$, then the expression for the arc length of the inner and outer surfaces of the board before and after rebound is:

$$\begin{cases} L_a = (r' + t)\alpha \\ L_b = r'\alpha' \end{cases} \quad (1)$$

where, r' represents the curvature radius of the inner surface of the plate before rebound; t is the thickness of the sheet; α and α represent bending angles of the plate before and after rebound, respectively. Dividing the two equations yields:

$$\frac{L_a}{L_b} = \frac{r' + t}{r'} \quad (2)$$

The expression for arc lengths of the upper and lower surfaces of the rebounded plate is:

$$\begin{cases} L'_a = L_a(1 - \varepsilon_a) = (r + t)\alpha \\ L'_b = L_b(1 + \varepsilon_b) = r\alpha \end{cases} \quad (3)$$

where r represents radius of the plate after rebound, $\varepsilon_a$ represents change in inner arc length of the plate after rebound, $\varepsilon_b$ represents change in the outer arc length of the plate after rebound.
Then, $$\frac{L_a}{L_b} = \frac{(r+t)(1+\varepsilon_b)}{r(1-\varepsilon_a)} \quad (4)$$

By combining equations (2) and (4), the following equation can be obtained:

$$R = \frac{r't(1+\varepsilon_b)}{t(1-\varepsilon_a) - r'(\varepsilon_b + \varepsilon_a)} \quad (5)$$

The stress on upper surface during the rebound process of the plate is $\sigma_a$. The stress on the lower surface is $\sigma_b$. According to Hooke's Law:

$$\begin{cases} \varepsilon_a = \frac{\sigma_a}{E} \\ \varepsilon_b = \frac{\sigma_b}{E} \end{cases} \quad (6)$$

Substituting equation (6) into equation (5) yields the expression for the radius r of the rebound of the plate as follows:

$$r = \frac{r't(E + \sigma_b)}{t(E - \sigma_a) - r'(\sigma_a + \sigma_b)} \quad (7)$$

For metal materials, their elastic modulus is much greater than the stress on the upper and lower surfaces of the plate. Therefore, equation (7) can be simplified as:

$$r = \frac{r'}{1 - \frac{r'}{Et}(\sigma_a + \sigma_b)} \quad (8)$$

Based on the assumption of a neutral layer, combined with knowledge of material mechanics, it can be inferred that:

$$\sigma_{max} = \sigma_{a,b} = \frac{M_{max} y_{max}}{I_z} = \frac{M_{max}}{W} \quad (9)$$

$$M_{max} = \left(K_1 + \frac{K_0 t}{r'}\right) W \sigma_s \quad (10)$$

where W is the bending section coefficient of the plate, $K_1$ is the cross-sectional shape coefficient of the plate, and $K_0$ is the relative strengthening coefficient of the material.

By combining equations (9) and (10), the expression for the relationship between the radius of the plate before and after rebound can be obtained:

$$r' = \frac{1 - \frac{K_0 \sigma_\square}{E}}{\left(1 + \frac{r K_1 \sigma_\square}{Et}\right)} r$$

where, r' represents curvature radius of inner surface of the plate before rebound, and r represents the radius of the plate after rebound.

2. Designing a Roll Bending Process of Four-Segment Circular Arc Variable Curvature Section Cylinder (Equivalent to Further Obtaining Process Parameters).

The specific process is a prior art that is known to those skilled in the art, and due to space limitations, it will not be explained in detail in this disclosure.

3. Calculating Displacement of the Side Rollers at Each Process Step (Equivalent to Further Obtaining Process Parameters).

Similarly, the specific process of calculating the displacement of the side rollers is known to those skilled in the art, and due to space limitations, it will not be explained in detail in this article.

4. Analyzing the Rebound Characteristics of Roll Bending of Cylinder with Variable Curvature Sections and Determining the Influence Factors of Rebound Compensation Error.

Establishing a four-segment arc variable curvature section roll bending model, performing finite element simulation of segmented roll bending, and performing rebound simulation on the post-processing file after roll bending. The law of compensating for rebound error in roll bending of cylinder with variable curvature section has been obtained. Specifically:

(1) The sectional shape of the cylinder selected in the embodiment is a four-segment circular arc near elliptical cross-section cylinder, and the near elliptical cross-section presents a tangential relationship between them, and is symmetrical on both sides. Its size parameters are the first arc radius of 1844.4 mm, the second arc radius of 644.4 mm, the third arc radius of 1694.4 mm, and the length of the cylinder is 8500 mm.

(2) Based on the above embodiments, performing finite element simulation of cylinder roll bending rebound, that is, first performing finite element simulation of segmented roll bending, and then performing rebound simulation again on the post-processing file after roll bending. Extracting the distribution of rebound amount of each simulated composition along the length direction of the plate, obtaining the first simulation result, and further obtaining the rebound variation curve shown in FIG. 3.

Figure 3:
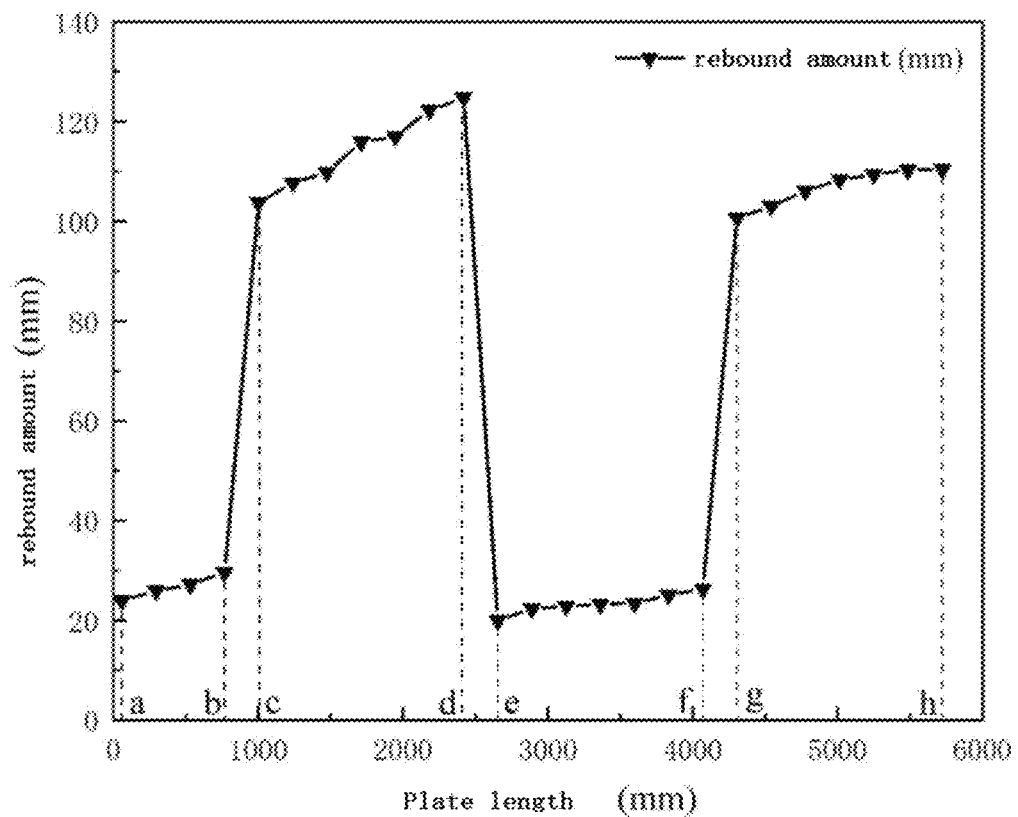
FIG. 3 is a rebound variation curve of an embodiment of the precision roll bending method for cylinder with variable curvature section provided by this disclosure.

As shown in FIG. 3, when only the first half of the first section is formed, there is no influence of the previous and subsequent forming sections during the forming process, and the rebound amount fluctuates within the range of 24±1 mm. The corresponding average forming radius error is 4.3 mm, and the forming accuracy error is about 0.63%, indicating high forming accuracy; When forming the first half of the arc and the second arc, the ab segment in the figure corresponds to the first half of the first arc of the four arc segments. The rebound amount of this segment is about 27±1 mm, and the average error of the corresponding forming radius is +35.6 mm. The forming accuracy error is 5.24%, and the rebound amount and forming accuracy are greater than the theoretical value; The rebound amount of the BC segment is 110±9 mm, and the average error of the corresponding forming radius is −63.3 mm. The forming accuracy error is 3.34%, and the rebound amount and forming radius are less than the theoretical value. The ab section shows significant changes in rebound and forming accuracy, while an additional cd section is added compared to only forming the first half of the first section, indicating that the later forming section will have a significant impact on the rebound and forming accuracy of the earlier forming section. Analysis shows that the ab segment is affected by the cd segment after forming. When the ab segment is formed and unloaded, it will rebound to the set curvature, and then the cd segment arc will be formed. However, due to the different forming radii of the cd segment, its corresponding rebound rate is also different. After the cd segment is formed and unloaded, its elastic deformation part will undergo elastic recovery. This process not only has a pulling effect on the previous arc (ab segment), but also increases the rebound amount of the arc, making the curvature radius of the ab segment larger. At the same time, the cd segment is affected by the pulling effect of the ab segment, making it unable to rebound to the predetermined curvature, resulting in its forming radius being smaller than the theoretical value. In the subsequent analysis of the rebound amount of each arc, the same pattern was also observed, and due to space constraints, it will not be repeated here.

(3) Based on the above analysis, it can be concluded that:

The compensation error for the rebound of each segment of the cylinder with variable curvature section is mainly affected by the pulling effect of the front and rear segments of the arc.

At the same time, the influence of the front and rear arc on the middle arc is mainly determined by the forming radius and length of the front and rear arc, as well as the forming radius and length of the middle arc. Therefore, the factors affecting the rebound compensation error of the variable curvature section cylinder body roll bending are:

forming radius $R_1$ and forming arc length $L_1$ of the front arc, forming radius $R_2$ and forming arc length $L_2$ of the middle arc, and forming radius $R_3$ and forming arc length $L_3$ of the rear arc of a certain arc. (Among them, "front" and "rear" are described based on the order of processing).

5. Establishing the Modified Rebound Compensation Equation for the Variable Curve Section Cylinder:

Using the Response Surface Methodology, establishing a relationship between the influence factors of rebound compensation error and the amount of rebound compensation error. Using the central composite experiment and setting different horizontal values based on various factors, carrying out finite element simulation of roll bending on different groups of variable curvature section cylinders. Finally, extracting simulation results data, and fitting the rebound compensation equation for this type of section cylinder using the Response Surface Methodology. Specifically:

Designing a central composite experiment with six factors (R1, L1, R2, L2, R3, L3) and five levels (−2, −1, 0, 1, 2) in Design-expert software. The values of each preset influencing factor are shown in Table 1. After deleting unreasonable experimental design schemes, the simulation results corresponding to the values of each preset influencing factor (rebound compensation error) are obtained as shown in Table 2.

TABLE 1 preset influence factor values

| level | forming radius of front section ($R_1$)/mm | forming length of front section ($L_1$)/mm | forming radius of middle section ($R_2$)/mm | forming length of middle section ($L_2$)/mm | forming radius of rear section ($R_3$)/mm | forming length of rear section ($L_3$)/mm |
|---|---|---|---|---|---|---|
| −2 | 300 | 300 | 300 | 300 | 300 | 300 |
| −1 | 725 | 850 | 725 | 850 | 725 | 850 |
| 0 | 1150 | 1400 | 1150 | 1400 | 1150 | 1400 |
| 1 | 1575 | 1950 | 1575 | 1950 | 1575 | 1950 |
| 2 | 2000 | 2500 | 2000 | 2500 | 2000 | 2500 |

TABLE 2

Part of test plan and test results

| Test number | $R_1$ (mm) | $L_1$ (mm) | $R_2$ (mm) | $L_2$ (mm) | $R_3$ (mm) | $L_3$ (mm) | μ (mm) |
|---|---|---|---|---|---|---|---|
| 1 | 2000 | 1400 | 1150 | 300 | 2000 | 1400 | 87.25 |
| 2 | 1575 | 850 | 725 | 1400 | 2000 | 850 | −184.81 |
| 3 | 725 | 300 | 1150 | 1400 | 1575 | 850 | −60.10 |
| 4 | 1150 | 850 | 725 | 300 | 1575 | 1400 | −231.21 |
| 5 | 300 | 300 | 1575 | 850 | 1150 | 1400 | −452.92 |
| 6 | 725 | 850 | 300 | 300 | 725 | 1400 | 14.96 |
| ... | ... | ... | ... | ... | ... | ... | ... |
| 25 | 1150 | 1400 | 2000 | 2500 | 1575 | 1400 | 876.33 |
| 26 | 725 | 850 | 2000 | 2500 | 300 | 300 | 1058.91 |
| 27 | 1575 | 850 | 2000 | 2500 | 1150 | 300 | 1008.69 |
| 28 | 725 | 850 | 2000 | 2500 | 1575 | 300 | 671.77 |
| 29 | 725 | 850 | 1575 | 1950 | 725 | 850 | 294.75 |
| 30 | 1150 | 1400 | 1575 | 1950 | 1150 | 1400 | 686.96 |

Further selecting a 2FI model for fitting, the results of the analysis of variance are shown in Table 3. From the analysis of variance results, it can be seen that the overall F-value of the model is 11.14, indicating good significance of the model. The p-value is less than 0.0001, indicating that the probability of fitting the model under the influence of noise is less than 0.01%. This indicates that all items in the model are significant and the model is reliable.

TABLE 3

Partial analysis of variance results of the 2FI model

| target | F value | p value | |
|---|---|---|---|
| model | 11.14 | <0.0001 | significant |
| BC | 12.15 | 0.0033 | |
| BF | 9.21 | 0.0084 | |
| CD | 11.48 | 0.0041 | |
| AB | 8.63 | 0.0102 | |
| E-$R_3$ | 5.28 | 0.0363 | |

Then, based on the residual curve of the obtained model, it can be seen that all points in the residual curve are distributed around a straight line, and there are no points that deviate too far from the straight line, indicating a high significance of the model.

After the model is determined, the following expression for rebound compensation error can be fitted:

$\mu = -1414.26 + 2.39R_1 + 0.78L_1 - 0.28R_2 - 0.037L_2 - 0.26R_3 - 0.39L_3 - 0.083R_1L_1 - 0.051R_1L_2 - 0.066R_1L_3 - 0.11L_1R_2 + 0.061L_1L_3 + 0.065R_2L_2 + 0.055R_2L_3 + 0.043L_1^2$

The above expression for rebound compensation error indicates that under the influence of various influence factors, there exists a compensation error (positive or negative) when using the rebound compensation equation mentioned earlier to perform rebound compensation on the target arc segment. In this case, an additional compensation is needed to eliminate this error. Therefore, the above expression for rebound compensation error is combined with the rebound compensation equation, and obtaining the revised rebound compensation equation:

$$r' = \frac{1 - \dfrac{K_0 \sigma_\square}{E}}{\left(1 + \dfrac{(r+\mu)K_1\sigma_\square}{Et}\right)}(r+\mu)$$

6. Roll Bending of Cylinder with Variable Curve Section

In order to verify the accuracy of this disclosure, in this embodiment, the modified rebound compensation equation is also used to calculate the process parameters of each segment of the four-segment circular arc variable curvature cylinder, obtaining new rolling forming process parameters. The new process parameter group is input into the finite element model for precise rolling forming simulation of the four-segment circular arc variable curvature section cylinder.

Extracting fifteen coordinate points along the edge of the plate in the simulation result, calculating the average radius of each segment of the circular arc after roll bending, and obtaining data shown in Tables 4 to 8. Based on these data, it can be concluded that using this disclosure method, the variable curvature section cylinder is formed using a four-roll bending equipment and precise rebound compensation is performed. The forming radius error of each curvature section of the cylinder is between 0.6% and 4%, and the formed cylinder meets the accuracy requirements.

TABLE 4

| | first half of the first arc | | | |
|---|---|---|---|---|
| Number | Node number | Forming radius/mm | Average value/mm | Forming radius error |
| 1, 4, 7 | 2, 8, 14 | 692.32 | | |
| 2, 5, 8 | 4, 10, 16 | 689.75 | 689.43 | 1.39% |
| 3, 6, 9 | 6, 12, 18 | 686.21 | | |

TABLE 5 the second arc

| Number | Node number | Forming radius/mm | Average value/mm | Forming radius error |
|---|---|---|---|---|
| 1, 4, 7 | 22, 38, 54 | 1957.57 | | |
| 2, 5, 8 | 27, 44, 60 | 1942.36 | 1951.54 | 3.02% |
| 3, 6, 9 | 32, 49, 66 | 1954.69 | | |

TABLE 6 the third arc

| Number | Node number | Forming radius/mm | Average value/mm | Forming radius error |
|---|---|---|---|---|
| 1, 4, 7 | 69, 86, 101 | 669.57 | | |
| 2, 5, 8 | 75, 91, 106 | 676.18 | 672.36 | 0.70% |
| 3, 6, 9 | 80, 96, 111 | 671.33 | | |

TABLE 7 the fourth arc

| Number | Node number | Forming radius/mm | Average value/mm | Forming radius error |
|---|---|---|---|---|
| 1, 4, 7 | 112, 128, 145 | 1829.36 | | |
| 2, 5, 8 | 118, 134, 150 | 1816.74 | 1824.16 | 3.71% |
| 3, 6, 9 | 123, 140, 156 | 1826.37 | | |

TABLE 8 last half of the first arc

| Number | Node number | Forming radius/mm | Average value/mm | Forming radius error |
|---|---|---|---|---|
| 1, 4, 7 | 159, 167, 175 | 674.23 | | |
| 2, 5, 8 | 162, 170, 178 | 671.15 | 670.91 | 1.34% |
| 3, 6, 9 | 164, 172, 181 | 667.32 | | |

The beneficial effects of this embodiment are:
1. By combining finite element simulation with the analysis of rebound in roll bending of cylindrical bodies with variable curvature sections, an accurate compensation equation for roll bending deformation rebound considering material elastic modulus, plate thickness, and curvature radius (i.e. the modified rebound compensation equation) is established, which solved the problems of inaccurate prediction and difficulty in accurate compensation of rebound in roll bending of cylinder with complex variable curvature sections.
2. Compared to traditional processing techniques, this disclosure can achieve accurate prediction and control of the cumulative rebound law of complex variable curvature section cylinder roll bending. Combined with fully automatic roll bending, the forming process does not require repeated manual trial and error, measurement, and calibration, greatly improving processing accuracy and production efficiency.

Figure 4:
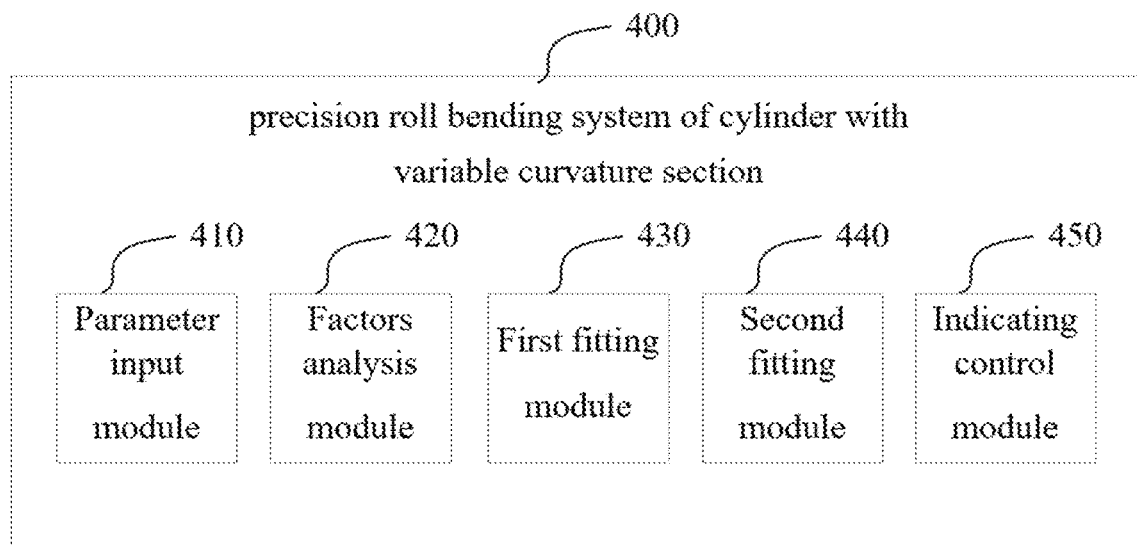
FIG. 4 is the system architecture diagram of an embodiment of the precision roll bending method for cylinder with variable curvature section provided by this disclosure.

In order to better implement the precision roll bending method of cylinder with variable curvature section in this disclosure, based on the precision roll bending method of cylinder with variable curvature section, please refer to FIG. 4, which is a structural schematic diagram of an embodiment of the precision roll bending system of cylinder with variable curvature section provided by this disclosure. The precision roll bending system of cylinder with variable curvature section 400 provided by this disclosure embodiment comprises:

Parameter input module 410, which is used to obtain process parameters of roll bending of a target cylinder, and establish a rebound compensation equation based on force analysis of the roll bending; the target cylinder comprises multiple arc segments;

Factors analysis module 420, which is used to carry out rebound simulation of cylinder roll bending based on the process parameters to obtain a first simulation result, and determine influence factors of rebound compensation error based on distribution of rebound amount in the first simulation result;

First fitting module 430, which is used to set multiple sets of different preset influence factor values of the influence factors of rebound compensation error; based on the multiple sets of preset influence factor values, combined with the process parameters, carrying out the rebound simulation of roll bending of different arc segments to obtain a second simulation result;

Second fitting module 440, which is used to fit multiple sets of preset influence factor values and corresponding rebound compensation errors in the second simulation result, and obtain expression of rebound compensation error.

Indicating control module 450, which is used to modify the rebound compensation equation according to the expression of rebound compensation error, and carry out precise control of roll bending of the target cylinder according to the modified rebound compensation equation and the process parameters.

It should be noted that the corresponding system 400 provided in the above embodiments can implement the technical solutions described in the above method embodiments. The specific implementation principles of the above modules or units can be found in the corresponding content of the above method embodiments, and will not be repeated here.

Figure 5:
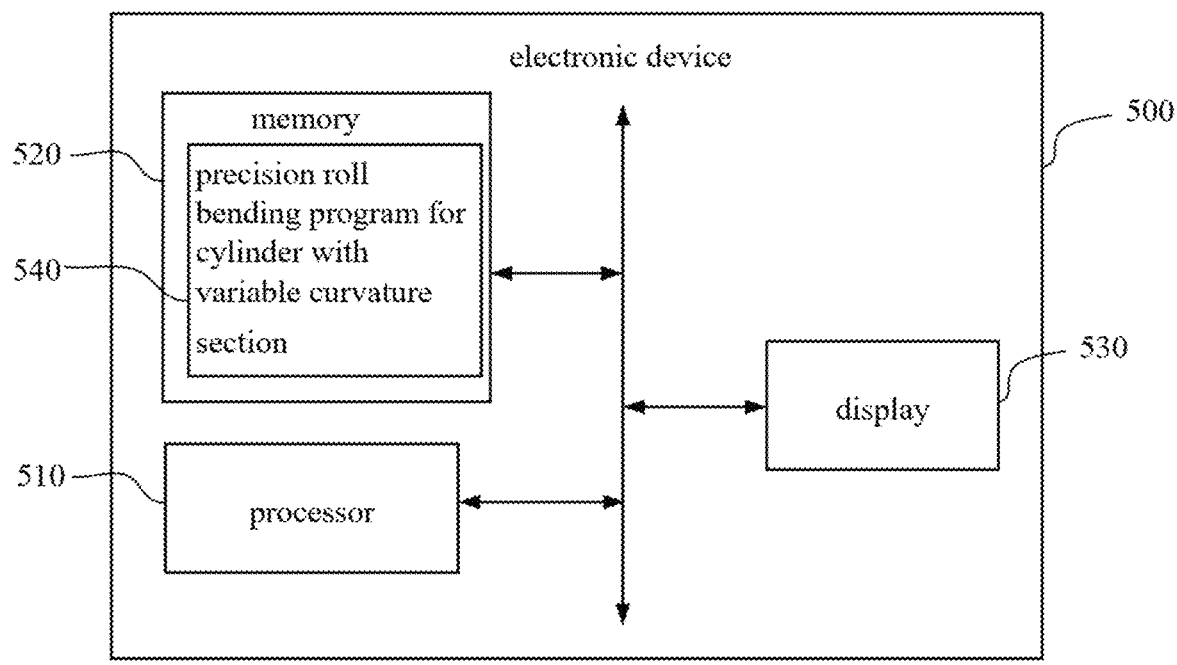
FIG. 5 is a schematic diagram of the structure of an embodiment of an electronic device provided by this disclosure.

Please refer to FIG. 5, which is a schematic diagram of the structure of an electronic device provided in this disclosure embodiment. Based on the precision roll bending method of cylinder with variable curvature section mentioned above, this disclosure also provides a precision roll bending device for cylinder with variable curvature section 500, which is the electronic device mentioned above. The precision roll bending device for cylinder with variable curvature section 500 can be a mobile terminal, desktop microcomputer, laptop, handheld computer, server, and other computing devices. The precision roll bending device for cylinder with variable curvature section 500 comprises a processor 510, a memory 520, and a display 530. FIG. 5 only shows some components of the precision roll bending device for cylinder with variable curvature section. However, it should be understood that it is not required to implement all the shown components, and more or fewer components can be implemented as substitutes.

In some embodiments, the memory 520 may be an internal storage unit of the precision roll bending device for cylinder with variable curvature section 500, such as a hard disk or memory of the precision roll bending device for cylinder with variable curvature section 500. In other embodiments, the memory 520 can also be an external storage device for the precision roll bending device for cylinder with variable curvature section 500, such as a plug-in hard disk, Smart Media Card (SMC), Secure Digital (SD) card, Flash Card, etc. equipped on the precision roll bending device 500 of a variable curvature section cylinder. Furthermore, the memory 520 may also include both internal storage units of the precision roll bending device for cylinder with variable curvature section 500 and external storage devices. Memory 520 is used to store application software and various data installed on the precision roll bending device for cylinder with variable curvature section 500, such as program codes for installing the precision roll bending equipment 500 for variable curvature section cylindrical bodies. Memory 520 can also be used to temporarily store data that has already been or will be output. In one embodiment, the memory 520 stores a precise roll bending program 540 for a variable curvature section cylinder, which can be executed by the processor 510 to achieve the precise roll bending method for the variable curvature section cylinder in various embodiments of the present application.

In some embodiments, the processor 510 may be a Central Processing Unit (CPU), microprocessor, or other data processing chip used to run program code stored in memory 520 or process data, such as executing precise roll bending method for cylinder with variable curvature section.

In some embodiments, the display 530 can be an LED display, LCD display, touch LCD display, or OLED (Organic Light Emitting Diode) touchscreen. The display 530 is used to display information on the precision roll bending device for cylinder with variable curvature section 500, as well as to display a visual user interface. The components 510-530 of the precision roll bending device for cylinder with variable curvature section 500 communicate with each other through the system bus.

In one embodiment, when the processor 510 executes the precision roll bending program for cylinder with variable curvature section 540 in the memory 520, the steps in the precision roll bending method for cylinder with variable curvature section as described above are implemented.

This embodiment also provides a computer-readable storage medium on which a precise roll bending program for a variable curvature section cylinder is stored. When the precise roll bending program for cylinder with variable curvature is executed by the processor, the steps in the above embodiment can be achieved.

This disclosure provides a precision roll bending method, system, and electronic device for cylinder with variable curvature section. The method first obtains process parameters of the roll bending of a target cylinder, and establishes a rebound compensation equation based on force analysis of the roll bending. The target cylinder comprises multiple arc segments. Then, based on the process parameters, the cylinder roll bending rebound simulation is carried out to obtain the first simulation result. Based on the distribution of rebound amount in the first simulation result, the influence factors of rebound compensation error are determined. Then, multiple sets of different preset influence factor values of rebound compensation error are set. Based on multiple preset influencing factor values and combined with the process parameters, roll bending rebound simulation of different arc segments is carried out to obtain the second simulation result. Then, the multiple preset influencing factor values and corresponding rebound compensation error values in the second simulation result are fitted to obtain the expression of rebound compensation error. Finally, the rebound compensation equation is corrected according to the expression of rebound compensation error, and the precision roll bending of the target cylinder is controlled based on the corrected rebound compensation equation and the process parameters. Compared to existing technologies, this disclosure uses multiple simulations of the rebound caused by cylinder roll bending to determine the factors that affect the rebound compensation error and the magnitude of the rebound compensation error that may be caused by these factors. Finally, an expression for the rebound compensation error is obtained to correct the rebound compensation equation, eliminate the error caused by rebound compensation, and ensure that the cylinder forming meets the expected accuracy requirements.

It is to be understood, however, that even though numerous characteristics and advantages of this disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A precision roll bending method for cylinder with variable curvature section, comprising:
obtaining process parameters of roll bending of a target cylinder, and establishing a rebound compensation equation based on force analysis of the roll bending; the target cylinder comprises multiple are segments;
carrying out rebound simulation of cylinder roll bending based on the process parameters to obtain a first simulation result, and determining influence factors of rebound compensation error based on distribution of rebound amount in the first simulation result;
setting multiple sets of different preset influence factor values of the influence factors of rebound compensation error; based on the multiple sets of preset influence factor values, combined with the process parameters, carrying out the rebound simulation of roll bending of different arc segments to obtain a second simulation result;
fitting multiple sets of preset influence factor values and corresponding rebound compensation errors in the second simulation result, and obtaining expression of rebound compensation error;
modifying the rebound compensation equation according to the expression of rebound compensation error, and carrying out precise control of roll bending of the target cylinder according to the modified rebound compensation equation and the process parameters;
wherein, fitting multiple sets of preset influence factor values and corresponding rebound compensation errors in the second simulation result, and obtaining expression of rebound compensation error, comprising:
based on Response Surface Methodology, multiple sets of preset influence factor values and corresponding rebound compensation error amounts in the second simulation result are fitted to obtain an expression for the rebound compensation error amount; the expression for the rebound compensation error amount is a polynomial with the rebound compensation error influence factor as independent variable and rebound compensation error amount as dependent variable;
wherein, the factors affecting the rebound compensation error comprise forming radius and forming arc length of three adjacent arc segments in the target cylinder;
wherein, the modified rebound compensation equation is:

$$r'=f(r+\mu)$$

where, r' represents the curvature radius of inner surface of the target cylinder before rebounding, r represents the curvature radius of the inner surface of the target cylinder after rebounding, and r'=f(r) represents the rebound compensation equation before correction, u represents the expression of the rebound compensation error amount.

2. The precision roll bending method for cylinder with variable curvature section according to claim 1, based on the distribution of rebound amount in the first simulation result, the influence factors of rebound compensation error are determined, comprising:

based on the distribution of rebound amount in the first simulation result, obtaining a rebound variation curve;
determining the factors affecting the rebound compensation error based on the variation law of the rebound amount of each arc segment in the rebound variation curve.

3. The precision roll bending method for cylinder with variable curvature section according to claim 1, setting multiple sets of different preset influence factor values of the influence factors of rebound compensation error, based on the multiple sets of preset influence factor values, combined with the process parameters, carrying out the rebound simulation of roll bending of different arc segments to obtain a second simulation result, specifically comprises:

based on a central composite experiment, designing multiple sets of preset influence factor values for the influence factors of rebound compensation error;
using multiple sets of different preset influence factor values as response influencing factors and rebound compensation error as response variables, combined with the process parameters, performing roll bending rebound simulation for different arc segments to obtain the second simulation result.

4. The precision roll bending method for cylinder with variable curvature section according to claim 3, based on a central composite experiment, designing multiple sets of preset influence factor values for the influence factors of rebound compensation error, comprising:

based on the central composite experience, using multiple rebound compensation error influencing factors as independent variables; based on multiple horizontal values, designing multiple sets of preset influencing factor values based on multiple factors and levels.

5. The precision roll bending method for cylinder with variable curvature section according to claim 1, the modified rebound compensation equation is:

$$r' = \frac{1 - \frac{K_0 \sigma_s}{E}}{\left(1 + \frac{(r+\mu)K_1 \sigma_s}{Et}\right)}(r+\mu)$$

where, $K_0$ represents the relative strengthening coefficient of the target cylinder's plate, $\sigma_s$ represents the yield stress of the target cylinder's plate, E represents the elastic modulus of the target cylinder's plate, $K_1$ represents sectional shape coefficient of the target cylinder's plate, and t represents the thickness of the target cylinder's plate.

6. An electronic device, comprising a memory and a processor, wherein, the memory is used to store programs;
the processor, coupled with the memory, is used to execute the program stored in the memory to achieve the steps of the precision roll bending method for cylinder with variable curvature section as claimed in claim 1.

7. A non-transitory computer-readable storage medium, which is used to store program or instruction that can be read by a computer, when the program or the instruction is executed by a processor, it can realize the steps of the precision roll bending method for cylinder with variable curvature section as claimed in claim 1.

* * * * *